US012609727B2

(12) United States Patent
Lee et al.

(10) Patent No.: US 12,609,727 B2
(45) Date of Patent: Apr. 21, 2026

(54) WIRELESS TRANSCEIVER DEVICE AND MATCHING CIRCUITS THEREOF

(71) Applicant: REALTEK SEMICONDUCTOR CORP., Hsinchu (TW)

(72) Inventors: Chia-Yi Lee, Hsinchu (TW); Chia-Jun Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 390 days.

(21) Appl. No.: 18/130,061

(22) Filed: Apr. 3, 2023

(65) Prior Publication Data

US 2023/0327698 A1 Oct. 12, 2023

(30) Foreign Application Priority Data

Apr. 6, 2022 (TW) .................................. 111113135

(51) Int. Cl.
*H04B 1/44* (2006.01)
*H03H 7/38* (2006.01)

(52) U.S. Cl.
CPC ................. *H04B 1/44* (2013.01); *H03H 7/38* (2013.01)

(58) Field of Classification Search
CPC ..................................... H03H 7/38; H04B 1/44
See application file for complete search history.

(56) References Cited

U.S. PATENT DOCUMENTS

| | | | | |
|---|---|---|---|---|
| 8,712,342 B2 * | 4/2014 | Maimon | ................. | H04B 1/44 |
| | | | | 455/73 |
| 10,720,956 B2 * | 7/2020 | Callender | ................. | H03F 3/21 |
| 10,963,655 B1 | 3/2021 | Lavedas et al. | | |
| 11,398,846 B2 * | 7/2022 | Yoo | ......................... | H03F 3/245 |
| 2021/0203373 A1 * | 7/2021 | Chan | ................... | H04B 1/0458 |
| 2022/0158685 A1 * | 5/2022 | Knopik | ................... | H04B 1/48 |
| 2023/0034531 A1 * | 2/2023 | Luo | .......................... | H03F 3/19 |

FOREIGN PATENT DOCUMENTS

| | | | | |
|---|---|---|---|---|
| CN | 107645315 A | 1/2018 | | |
| WO | WO-2017022370 A1 * | 2/2017 | ............. | H01Q 1/243 |

* cited by examiner

*Primary Examiner* — Yuwen Pan

(74) *Attorney, Agent, or Firm* — Birch, Stewart, Kolasch & Birch, LLP

(57) ABSTRACT

A wireless transceiver device and matching circuits thereof are provided. In the wireless transceiver device, a first matching circuit is electrically coupled to an antenna and a transmission circuit. In the first matching circuit, a first capacitor is electrically coupled to the antenna and a first switching component, the first switching component is electrically coupled to a reference voltage, a first active component having a first threshold voltage is coupled in parallel with the first switching component, a first inductor of an inductor pair is electrically coupled to the antenna and the reference voltage, and a second inductor of the inductor pair is electrically coupled to the transmission circuit. When the voltage across the first active component is greater than the first threshold voltage, the first active component is turned on, thus reducing the voltage across the first switching component to protect the first switching component.

11 Claims, 6 Drawing Sheets

WIRELESS TRANSCEIVER DEVICE AND MATCHING CIRCUITS THEREOF

CROSS-REFERENCE TO RELATED APPLICATION

This non-provisional application claims priority under 35 U.S.C. § 119(a) to Patent Application No. 111113135 filed in Taiwan, R.O.C. on Apr. 6, 2022, the entire contents of which are hereby incorporated by reference.

BACKGROUND

Technical Field

The instant disclosure is related to a wireless transceiver device, especially a transceiver device capable of protecting the switching components within the wireless transceiver device and first and second matching circuits implemented in the wireless transceiver device.

Related Art

In order to receive and emit radio frequency (RF) signals, a wireless transceiver device is usually used for the process. A wireless transceiver device known to the inventor at least includes a transmission circuit (TX) and a receiver circuit (RX). The transmission circuit and the receiver circuit are usually designed individually and are then combined with appropriate matching circuits and antenna (antennae) to emit or receive radio frequency signals.

However, in a matching circuit for a transmission circuit or a receiver circuit, when a spike of large current is generated, an inductor pair (also known as a balun) in the transmission circuit generally acts as a discharge path to direct the large current towards the low resistance of a ground, while the other components in a matching circuit, such as capacitors and switching components, are still under the risk of damage due to large voltages across them.

SUMMARY

In view of the above, the instant disclosure provides a wireless transceiver device comprising an antenna, a transmission circuit, a first matching circuit, a second matching circuit, and a receiver circuit. The antenna is adapted to emit a first radio frequency signal or receive a second radio frequency signal. The transmission circuit is adapted to generate the first radio frequency signal. The first matching circuit electrically connects the antenna and the transmission circuit and transmits the first radio frequency signal to the antenna. The first matching circuit comprises a first capacitor, a first switching component, a first active component having a first threshold voltage, and an inductor pair. One of two terminals of the first capacitor is electrically coupled to the antenna. The first switching component is electrically coupled the other terminal of the first capacitor and a reference voltage. The first active component is coupled in parallel with the first switching component, and when a voltage across the first active component is greater than the first threshold voltage, the first active component is turned on and in a conduction state, thus reducing the voltage across the first switching component. The inductor pair comprises a first inductor and a second inductor, the first inductor is electrically coupled the antenna and the reference voltage and is coupled in parallel with the first capacitor and the first switching component, and the second inductor is electrically coupled to the transmission circuit. The second matching circuit is electrically coupled to the antenna so as to transmit the second radio frequency signal. The receiver circuit is electrically coupled to the second matching circuit so as to receive the second radio frequency signal from the second matching circuit.

In some exemplary embodiments of the instant disclosure, the second matching circuit comprises a third inductor, a second capacitor, and a second switching component. One of two terminals of the third inductor is electrically coupled to the antenna. The second capacitor is electrically coupled the other terminal of the third inductor and the receiver circuit. One of two terminals of the second switching component is electrically coupled between the third inductor and the second capacitor, and the other terminal of the second switching component is electrically coupled to the reference voltage. Besides, the second matching circuit further comprises a second active component having a second threshold voltage and coupled in parallel with the second switching component. When the voltage across the second active component is greater than the second threshold voltage, the second active component is turned on and in a conduction state, thus reducing the voltage across the second switching component.

In some exemplary embodiments, the second matching circuit comprises a second capacitor, a third inductor, a third capacitor, a second switching component, a second active component having a second threshold voltage, and a third switching component. One of two terminals of the second capacitor is electrically coupled to the antenna. The third inductor is electrically coupled the other terminal of the second capacitor and the receiver circuit. One of two terminals of the third capacitor is electrically coupled between the second capacitor and the third inductor. One of two terminals of the second switching component is electrically coupled to the other terminal of the third capacitor, and the other terminal of the second switching component is electrically coupled to the reference voltage. The second active component is coupled in parallel with the second switching component, and when the voltage across the second active component is greater than the second threshold voltage, the second active component is turned on and in a conduction state, thus reducing the voltage across the second switching component. One of two terminals of the third switching component is electrically coupled between the third inductor and the receiver circuit, and the other terminal of the third switching component is electrically coupled to the reference voltage.

The instant disclosure also provides a first matching circuit of a wireless transceiver device. The first matching circuit is electrically coupled between an antenna and a transmission circuit, and the first matching circuit comprises a first capacitor, a first switching component, a first active component having a first threshold voltage, and an inductor pair. One of two terminals of the first capacitor is electrically coupled to the antenna. The first switching component is electrically coupled the other terminal of the first capacitor and a reference voltage. The first active component is coupled in parallel with the first switching component, and when a voltage across the first active component is greater than the first threshold voltage, the first active component is turned on and in a conduction state, thus reducing the voltage across the first switching component. The inductor pair comprises a first inductor and a second inductor, the first inductor is electrically coupled the antenna and the reference voltage and is coupled in parallel with the first capacitor and the first switching component, and the second inductor is electrically coupled to the transmission circuit.

In some exemplary embodiments, the first active component is a P-type metal-oxide semiconductor field-effect transistor (P-MOSFET), a diode, or two inversely shunted diodes.

The instant disclosure further provides a second matching circuit of a wireless transceiver device. The second matching circuit is electrically coupled between an antenna and a receiver circuit, and the second matching circuit comprises a third inductor, a second capacitor, a second switching component, and a second active component having a second threshold voltage. One of two terminals of the third inductor is electrically coupled to the antenna. The second capacitor is electrically coupled the other terminal of the third inductor and the receiver circuit. One of two terminals of the second switching component is electrically coupled between the third inductor and the second capacitor, and the other terminal of the second switching component is electrically coupled to a reference voltage. The second active component is coupled in parallel with the second switching component, and when a voltage across the second active component is greater than the second threshold voltage, the second active component is turned on and in a conduction state, thus reducing the voltage across the second switching component.

The instant disclosure even further provides a second matching circuit of a wireless transceiver device. The second matching circuit is electrically coupled between an antenna and a receiver circuit, and the second matching circuit comprises a second capacitor, a third inductor, a third capacitor, a second switching component, a second active component having a second threshold voltage, and a third switching component. One of two terminals of the second capacitor is electrically coupled to the antenna. The third inductor is electrically coupled the other terminal of the second capacitor and the receiver circuit. One of two terminals of the third capacitor is electrically coupled between the second capacitor and the third inductor. One of two terminals of the second switching component is electrically coupled to the other terminal of the third capacitor, and the other terminal of the second switching component is electrically coupled to a reference voltage. The second active component is coupled in parallel with the second switching component, and when a voltage across the second active component is greater than the second threshold voltage, the second active component is turned on and in a conduction state, thus reducing the voltage across the second switching component. One of two terminals of the third switching component is electrically coupled between the third inductor and the receiver circuit, and the other terminal of the third switching component is electrically coupled to the reference voltage.

In some exemplary embodiments, the second active component is a P-MOSFET, a diode, or two inversely shunted diodes.

In summary of the above, the instant disclosure provides a wireless transceiver device and matching circuits thereof. In the wireless transceiver device and the matching circuits thereof according to one or some embodiments of the instant disclosure, an active component having a threshold voltage is coupled in parallel with the switching component. The switching component is prone to damage due to large transient current. As a result, the voltage across the active component is used to turn on the active component, and thus the active component forms a low-resistance discharge path towards the reference voltage. Consequently, the voltage across the switching component is reduced, and the effect of protecting the switching component is realized.

BRIEF DESCRIPTION OF THE DRAWINGS

The disclosure will become more fully understood from the detailed description given herein below for illustration only, and thus not limitative of the disclosure, wherein.

DETAILED DESCRIPTION

Regarding the terms such as "first" and "second" used in the instant disclosure, they are used to differentiate different components rather than sequencing them or limiting their differences, and they are not meant to limit the scope of the instant disclosure.

Figure 1:
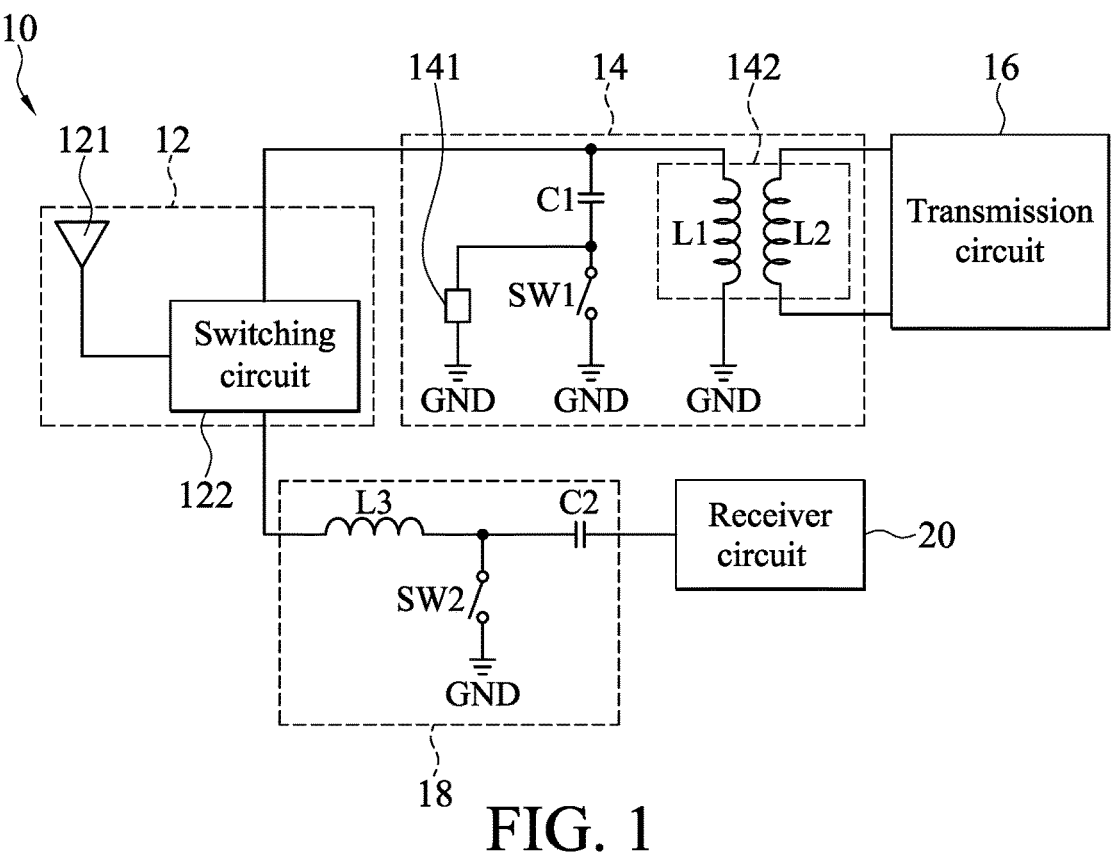
FIG. 1 illustrates a schematic circuit diagram of a wireless transceiver device according to an exemplary embodiment of the instant disclosure.

FIG. 1 illustrates a schematic circuit diagram of a wireless transceiver device according to an exemplary embodiment of the instant disclosure. Please refer to FIG. 1. The wireless transceiver device 10 comprises an antenna 12, a first matching circuit 14, a transmission circuit 16, a second matching circuit 18, and a receiver circuit 20. The antenna 12 is adapted to emit a first radio frequency signal or receive a second radio frequency signal, wherein the antenna 12 further comprises an antenna 121 and a switching circuit 122. The antenna 121 is electrically coupled to the switching circuit 122 so that the switching circuit 122 can be used to switch an operation mode of the antenna 121 between a transmitting mode and a receiving mode. The first matching circuit 14 is electrically coupled the antenna 12 and the transmission circuit 16 and transmits the first radio frequency signal to the antenna 12. When the wireless transceiver device 10 is in the transmitting mode, the transmission circuit 16 generates a first radio frequency signal, which transmits through the first matching circuit 14 and is emitted by the antenna 12. The second matching circuit 18 is electrically coupled the antenna 12 and the receiver circuit so as to transmit the second radio frequency signal. When the wireless transceiver device 10 is in the receiving mode, after the antenna 12 receives the second radio frequency signal, the second radio frequency signal is transmitted through the second matching circuit 18 to the receiver circuit 20 for processing.

Please refer to FIG. 1. In this exemplary embodiment, the first matching circuit 14 comprises a first capacitor C1, a first switching component SW1, a first active component 141 having a first threshold voltage, and an inductor pair 142. One of two terminals of the first capacitor C1 is electrically coupled to the antenna 12, and the other terminal of the first capacitor C1 is coupled to the first switching component SW1. The first switching component SW1 is electrically coupled the other terminal of the first capacitor C1 and a reference voltage, such as a ground GND. One of two terminals of the first active component 141 is electrically coupled to the first capacitor C1, and the other terminal of the first active component 141 is coupled to the ground GND. As a result, the first active component 141 is coupled in parallel with the first switching component SW1. When a voltage across the first active component 141 is greater than the first threshold voltage, the first active component 141 is turned on and in a conduction state, thus reducing the voltage across the first switching component SW1 so as to realize the effect of protecting the first switching component SW1. The inductor pair 142 comprises a first inductor L1 and a second inductor L2. The first inductor L1 is electrically coupled the antenna 12 and the ground GND and is coupled in parallel with the first capacitor C1 and the first switching component SW1, and the second inductor L2 is electrically coupled to the transmission circuit 16.

Please refer to FIG. 1. In this exemplary embodiment, the second matching circuit 18 comprises a third inductor L3, a second capacitor C2, and a second switching component SW2. One of two terminals of the third inductor L3 is electrically coupled to the antenna 12, and the other terminal of the third inductor L3 is electrically coupled to the second capacitor C2. The second capacitor C2 is electrically coupled the other terminal of the third inductor L3 and the receiver circuit 20. One of two terminals of the second switching component SW2 is electrically coupled between the third inductor L3 and the second capacitor C2, and the other terminal of the second switching component SW2 is electrically coupled to the ground GND.

Figure 2:
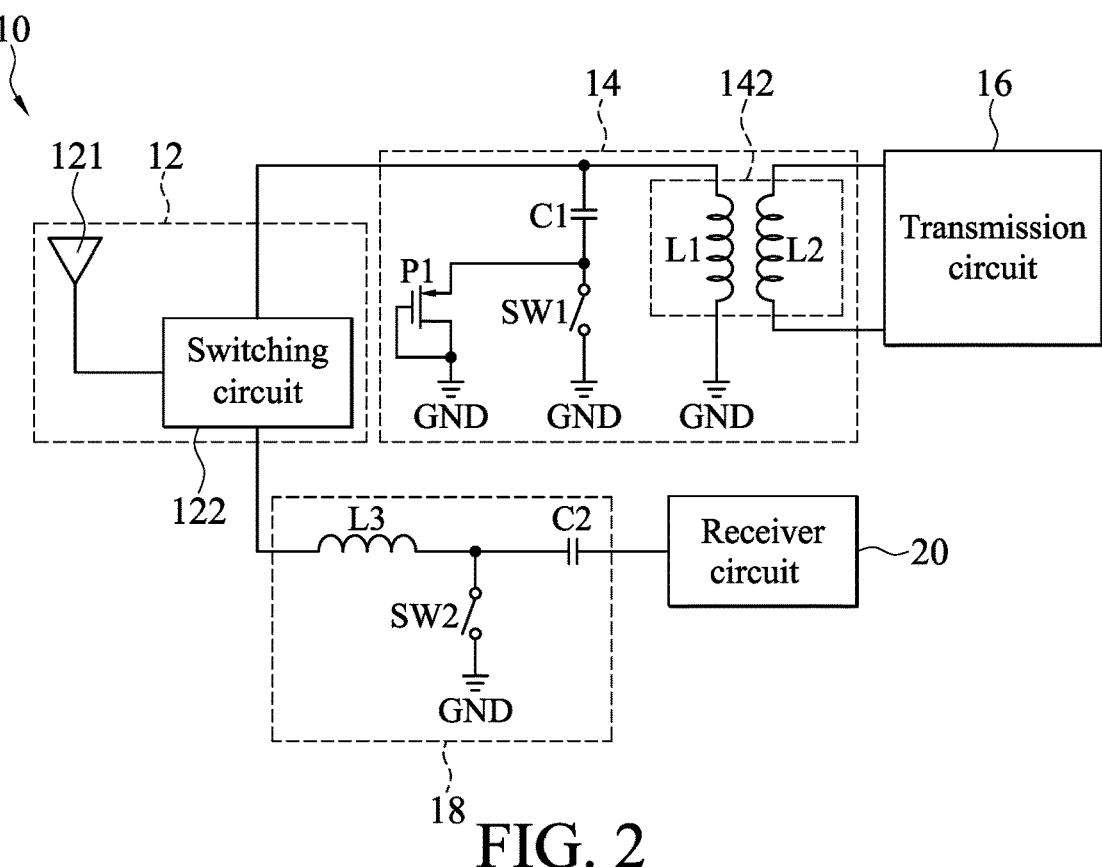
FIG. 2 illustrates a schematic circuit diagram of a wireless transceiver device having a P-MOSFET according to an exemplary embodiment of the instant disclosure.

Please refer to both FIG. 1 and FIG. 2. FIG. 2 illustrates a schematic circuit diagram of a wireless transceiver device having a P-MOSFET according to an exemplary embodiment of the instant disclosure. In this exemplary embodiment, in the first matching circuit 14, the first active component 141 is a P-MOSFET P1, as shown in FIG. 2. The P-MOSFET P1 has a source, a gate, and a drain. The P-MOSFET P1 is diode-connected. That is, the source of the P-MOSFET P1 is coupled between the first capacitor C1 and the first switching component SW1, and the gate and the drain of the P-MOSFET P1 are both coupled to the ground GND, so that the P-MOSFET P1 is coupled in parallel with the first switching device SW1. Because the gate and the drain of the P-MOSFET P1 are at a steady low electric potential, when a large transient current from the antenna 12 enters, the source of the P-MOSFET P1 fluctuates accordingly. When a source-gate voltage of the P-MOSFET P1 is greater than the first threshold voltage, the P-MOSFET P1 is in a conduction state and thus a low-resistance discharge path towards the ground GND is formed. As a result, the low-resistance discharge path keeps the large current from flowing through the first switching component SW1 and realizes the effect of protecting the first switching component SW1.

In an exemplary embodiment, as shown in FIG. 2, the first threshold voltage of the P-MOSFET P1 is 0.3~0.4 V.

Figure 3:
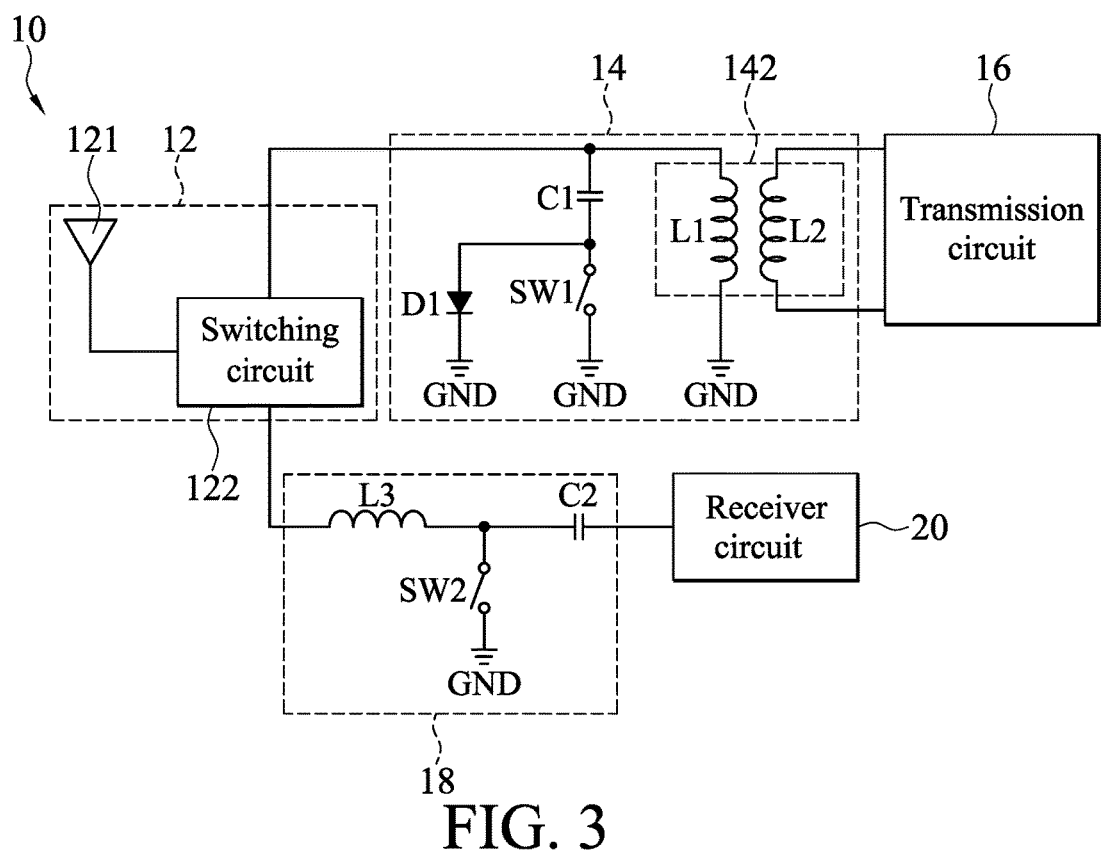
FIG. 3 illustrates a schematic circuit diagram of a wireless transceiver device having a diode according to an exemplary embodiment of the instant disclosure.

Please refer to both FIG. 1 and FIG. 3. FIG. 3 illustrates a schematic circuit diagram of a wireless transceiver device having a diode according to an exemplary embodiment of the instant disclosure. In this exemplary embodiment, in the first matching circuit 14, the first active component 141 is a diode D1, as shown in FIG. 3. An anode of the diode D1 is coupled between the first capacitor C1 and the first switching component SW1, and a cathode of the diode D1 is coupled to the ground GND, so that the diode D1 is coupled in parallel with the first switching device SW1. When a large transient current from the antenna 12 enters, the voltage across the diode D1 will be greater than the first threshold voltage, and thus the diode D1 will be in a conduction state and thus a low-resistance discharge path towards the ground GND is formed. As a result, the low-resistance discharge path keeps the large current from flowing through the first switching component SW1 and realizes the effect of protecting the first switching component SW1.

In an exemplary embodiment, as shown in FIG. 3, the first threshold voltage of the diode D1 is 0.7 V.

Figure 4:
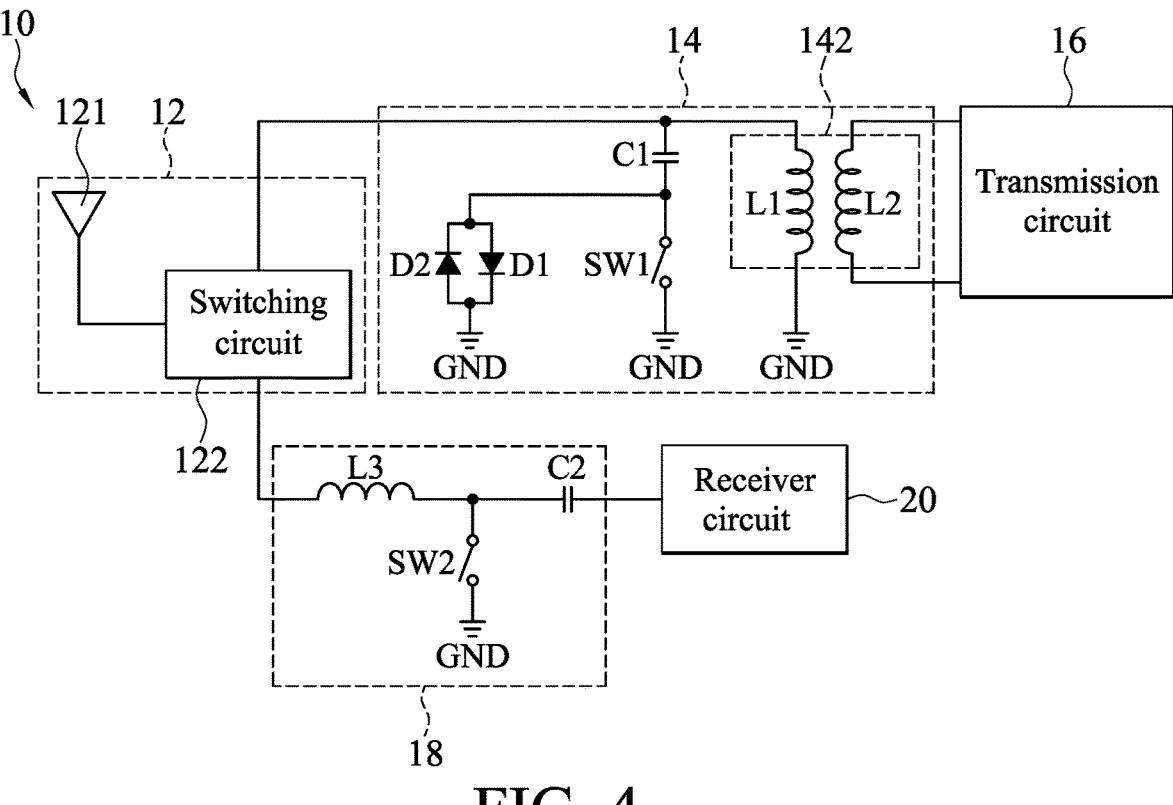
FIG. 4 illustrates a schematic circuit diagram of a wireless transceiver device having two inversely shunted diodes according to an exemplary embodiment of the instant disclosure.

Please refer to both FIG. 1 and FIG. 4. FIG. 4 illustrates a schematic circuit diagram of a wireless transceiver device having two inversely shunted diodes according to an exemplary embodiment of the instant disclosure. In this exemplary embodiment, in the first matching circuit 14, the first active component 141 is two inversely shunted diodes D1, D2, as shown in FIG. 4. The anode of the diode D1 is coupled between the first capacitor C1 and the first switching component SW1, and the cathode of the diode D1 is coupled to the ground GND. The cathode of the diode D2 is coupled between the first capacitor C1 and the first switching component SW1, and the anode of the diode D2 is coupled to the ground GND, so that the diodes D1, D2 are inversed and coupled in parallel with each other, and the diodes D1, D2 are also coupled in parallel with the first switching device SW1 so as to provide bidirectional protection. When a large transient current from the antenna 12 enters, the voltage across the diode D1 will be greater than the first threshold voltage, and thus the diode D1 will be in a conduction state and thus a low-resistance discharge path towards the ground GND is formed. As a result, the low-resistance discharge path keeps the large current from flowing through the first switching component SW1 and realizes the effect of protecting the first switching component SW1.

In some exemplary embodiment, the first switching component SW1 is an N-type metal-oxide semiconductor field-effect transistor (N-MOSFET).

Figure 5:
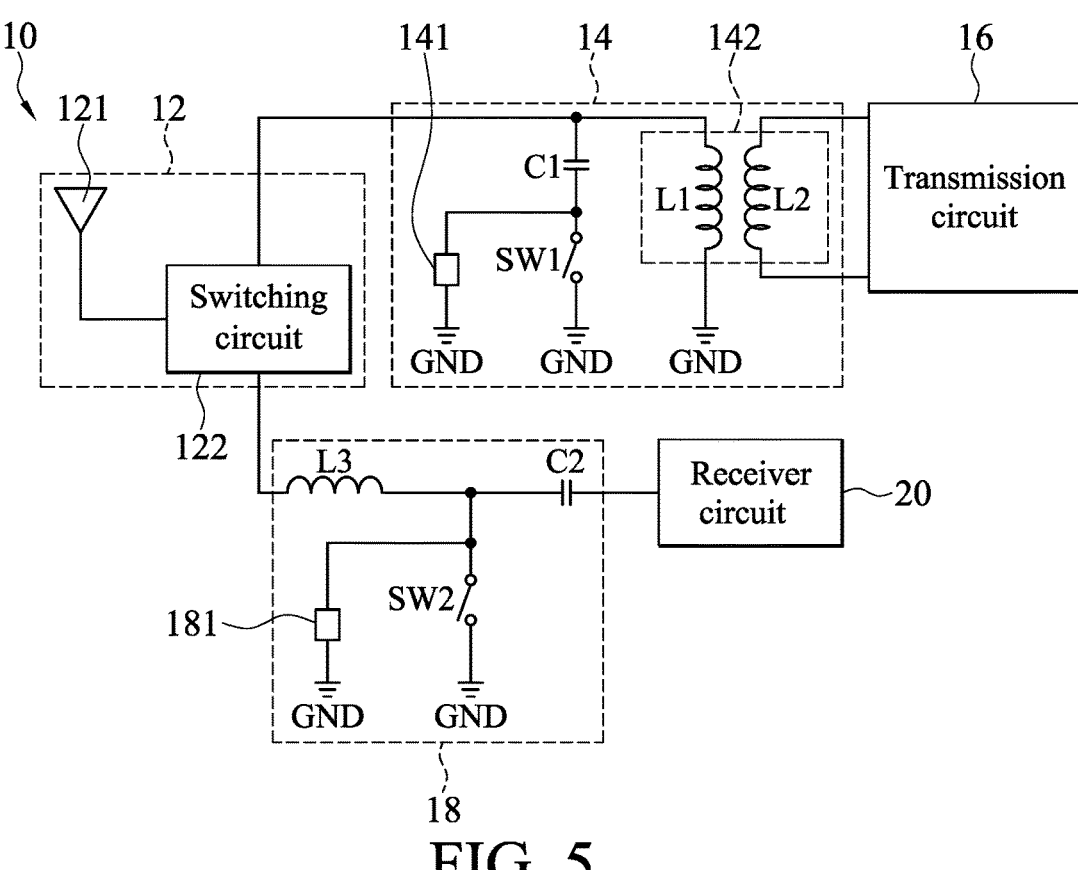
FIG. 5 illustrates a schematic circuit diagram of a wireless transceiver device according to another exemplary embodiment of the instant disclosure.

FIG. 5 illustrates a schematic circuit diagram of a wireless transceiver device according to another exemplary embodiment of the instant disclosure. Please refer to FIG. 5. The wireless transceiver device 10 comprises an antenna 12, a first matching circuit 14, a transmission circuit 16, a second matching circuit 18, and a receiver circuit 20. The first matching circuit 14 comprises a first capacitor C1, a first switching component SW1, a first active component 141 having a first threshold voltage, and an inductor pair 142. One of two terminals of the first capacitor C1 is electrically coupled to the antenna 12, and the other terminal of the first capacitor C1 is coupled to the first switching component SW1. The first switching component SW1 is electrically coupled the other terminal of the first capacitor C1 and a reference voltage, such as a ground GND. One of two terminals of the first active component 141 is electrically coupled to the first capacitor C1, and the other terminal of the first active component 141 is coupled to the ground GND. As a result, the first active component 141 is coupled in parallel with the first switching component SW1. When a voltage across the first active component 141 is greater than the first threshold voltage, the first active component 141 is turned on and in a conduction state, thus reducing the voltage across the first switching component SW1 so as to realize the effect of protecting the first switching component SW1. The inductor pair 142 comprises a first inductor L1 and a second inductor L2. The first inductor L1 is electrically coupled the antenna 12 and the ground GND and is coupled in parallel with the first capacitor C1 and the first switching component SW1, and the second inductor L2 is electrically coupled to the transmission circuit 16. The second matching circuit 18 comprises a third inductor L3, a second capacitor C2, a second switching component SW2, and a second active component 181 having a second threshold voltage. One of two terminals of the third inductor L3 is electrically coupled to the antenna 12, and the other terminal of the third inductor L3 is electrically coupled to the second capacitor C2. The second capacitor C2 is electrically coupled the other terminal of the third inductor L3 and the receiver circuit 20. One of two terminals of the second switching component SW2 is electrically coupled between the third inductor L3 and the second capacitor C2, and the other terminal of the second switching component SW2 is electrically coupled to the ground GND. One of two terminals of the second active component 181 is electrically coupled between the third inductor L3 and the second capacitor C2, and the other terminal of the second active component 181 is electrically coupled to the ground GND. As a result, the second active component 181 is coupled in parallel with the second switching component SW2. When the voltage across the second active component 181 is greater than the second threshold voltage, the second active component is turned on and in a conduction state, thus reducing the voltage across the second switching component SW2 so as to realize the effect of protecting the second switching component SW2.

Figure 6:
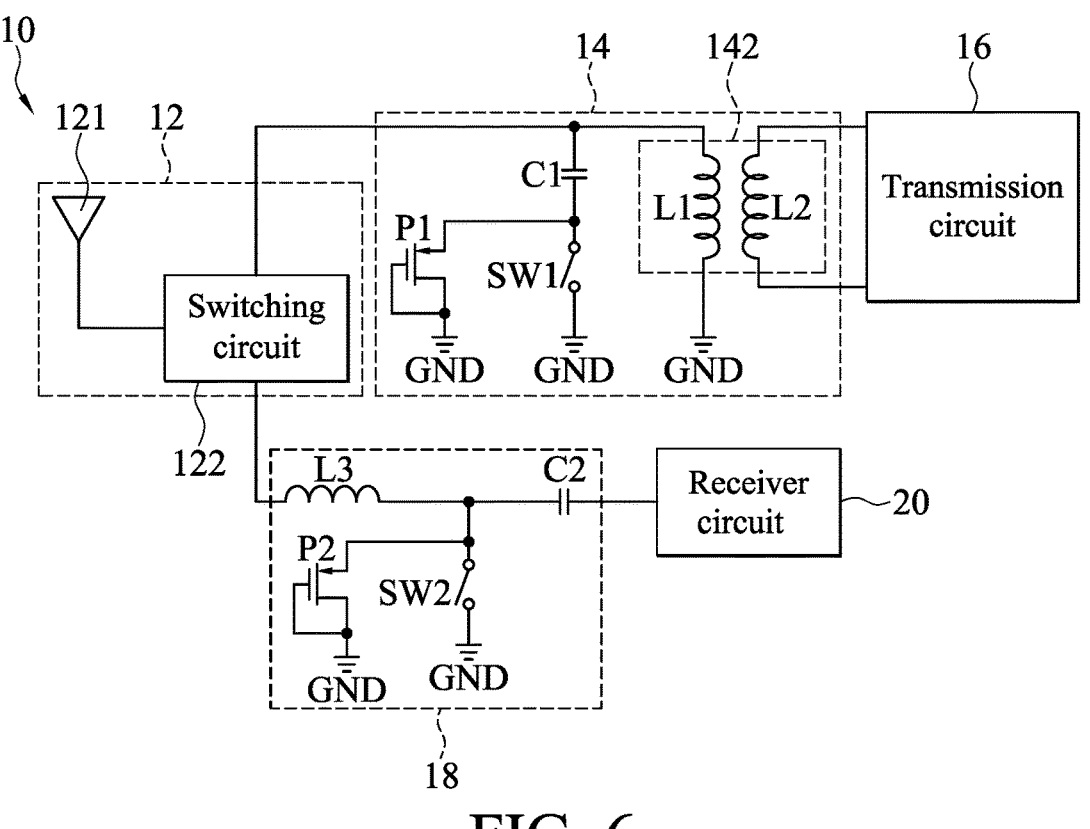
FIG. 6 illustrates a schematic circuit diagram of a wireless transceiver device having a P-MOSFET according to another exemplary embodiment of the instant disclosure.

Please refer to both FIG. 5 and FIG. 6. FIG. 6 illustrates a schematic circuit diagram of a wireless transceiver device having a P-MOSFET according to another exemplary embodiment of the instant disclosure. In this exemplary embodiment, in the first matching circuit 14, the first active component 141 is a P-MOSFET P1, and in the second matching circuit 18, the second active component 181 is a P-MOSFET P2, as shown in FIG. 6. The P-MOSFET P1 has the source, a gate, and a drain. The source of the P-MOSFET P1 is coupled between the first capacitor C1 and the first switching component SW1, and the gate and the drain of the P-MOSFET P1 are both coupled to the ground GND, so that the P-MOSFET P1 is coupled in parallel with the first switching device SW1. The source of the P-MOSFET P2 is coupled between the third inductor L3 and the second capacitor C2, and the gate and the drain of the P-MOSFET P2 are both coupled to the ground GND, so that the P-MOSFET P2 is coupled in parallel with the second switching device SW2. Because the gates and the sources of the P-MOSFETs P1, P2 are all at a steady low electric potential, when a large transient current from the antenna 12 enters, the sources of the P-MOSFETs P1, P2 fluctuate accordingly. When the source-gate voltage of the P-MOSFET P1 is greater than the first threshold voltage, the P-MOSFET P1 is in a conduction state and thus a low-resistance discharge path towards the ground GND is formed. As a result, the low-resistance discharge path keeps the large current from flowing through the first switching component SW1 and realizes the effect of protecting the first switching component SW1. When the source-gate voltage of the P-MOSFET P2 is greater than the second threshold voltage, the P-MOSFET P2 is in a conduction state and thus a low-resistance discharge path towards the ground GND is formed. As a result, the low-resistance discharge path keeps the large current from flowing through the second switching component SW2 and realizes the effect of protecting the second switching component SW2.

Figure 7:
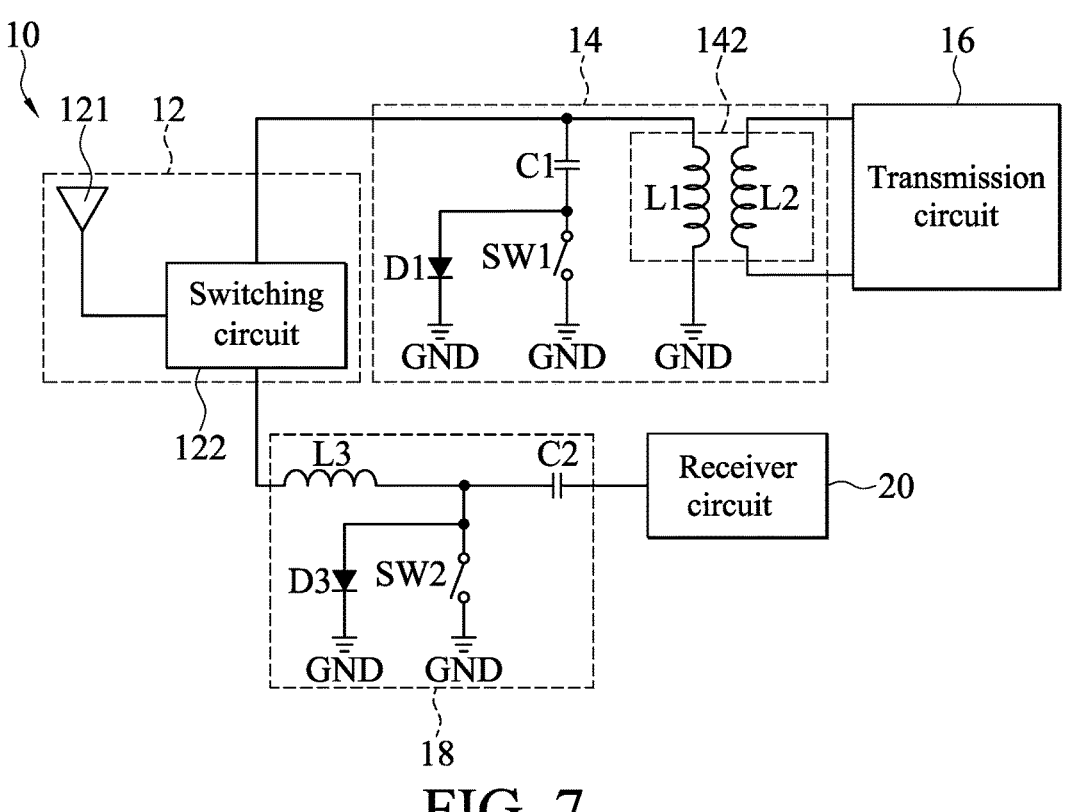
FIG. 7 illustrates a schematic circuit diagram of a wireless transceiver device having a diode according to another exemplary embodiment of the instant disclosure.

Please refer to both FIG. 5 and FIG. 7. FIG. 7 illustrates a schematic circuit diagram of a wireless transceiver device having a diode according to another exemplary embodiment of the instant disclosure. In this exemplary embodiment, in the first matching circuit 14, the first active component 141 is a diode D1, and in the second matching circuit 18, the second active component 181 is also a diode D3, as shown in FIG. 7. The anode of the diode D1 is coupled between the first capacitor C1 and the first switching component SW1, and the cathode of the diode D1 is coupled to the ground GND, so that the diode D1 is coupled in parallel with the first switching device SW1. The anode of the diode D3 is coupled between the third inductor L3 and the second capacitor C2, and the cathode of the diode D3 is coupled to the ground GND, so that the diode D3 is coupled in parallel with the second switching device SW2. When a large transient current from the antenna 12 enters the first matching circuit 14, the voltage across the diode D1 will be greater than the first threshold voltage, and thus the diode D1 will be in a conduction state and thus a low-resistance discharge path towards the ground GND is formed. As a result, the low-resistance discharge path keeps the large current from flowing through the first switching component SW1 and realizes the effect of protecting the first switching component SW1. When a large transient current from the antenna 12 enters the second matching circuit 18, the voltage across the diode D3 will be greater than the second threshold voltage, and thus the diode D3 will be in a conduction state and thus a low-resistance discharge path towards the ground GND is formed. As a result, the low-resistance discharge path keeps the large current from flowing through the second switching component SW2 and realizes the effect of protecting the second switching component SW2.

Figure 8:
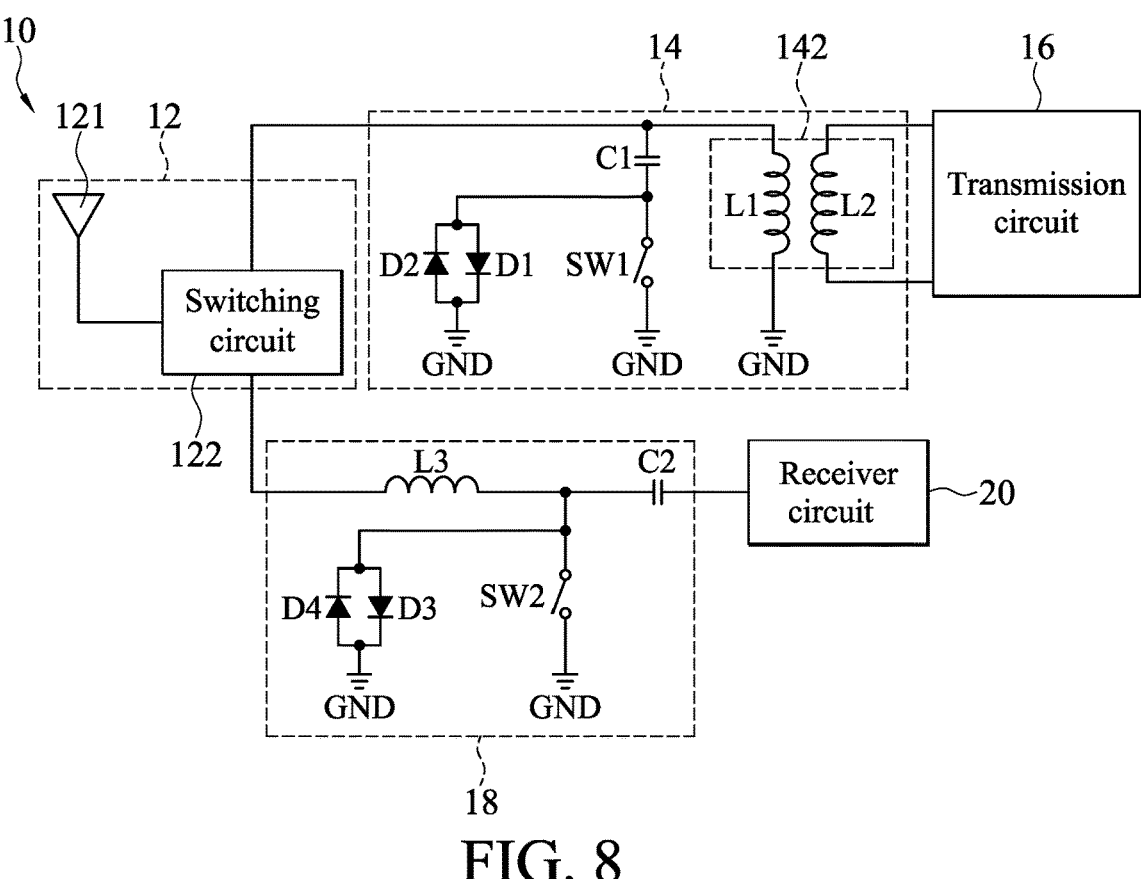
FIG. 8 illustrates a schematic circuit diagram of a wireless transceiver device having two inversely shunted diodes according to another exemplary embodiment of the instant disclosure.

Please refer to both FIG. 5 and FIG. 8. FIG. 8 illustrates a schematic circuit diagram of a wireless transceiver device having two inversely shunted diodes according to another exemplary embodiment of the instant disclosure. In this exemplary embodiment, in the first matching circuit 14, the first active component 141 is two inversely shunted diodes D1, D2, and in the second matching circuit 18, the second active component 181 is two inversely shunted diodes D3, D4, as shown in FIG. 8. The anode of the diode D1 is coupled between the first capacitor C1 and the first switching component SW1, and the cathode of the diode D1 is coupled to the ground GND. The cathode of the diode D2 is coupled between the first capacitor C1 and the first switching component SW1, and the anode of the diode D2 is coupled to the ground GND, so that the diodes D1, D2 are inversed and coupled in parallel with each other, and the diodes D1, D2 are also coupled in parallel with the first switching device SW1 so as to provide bidirectional protection. The anode of the diode D3 is coupled between the third inductor L3 and the second capacitor C2, and the cathode of the diode D3 is coupled to the ground GND. The cathode of the diode D4 is coupled between the third inductor L3 and the second capacitor C2, and the anode of the diode D4 is coupled to the ground GND, so that the diodes D3, D4 are inversed and coupled in parallel with each other, and the diodes D3, D4 are also coupled in parallel with the second switching device SW2 so as to provide bidirectional protection. When a large transient current from the antenna 12 enters the first matching circuit 14, the voltage across the diode D1 will be greater than the first threshold voltage, and thus the diode D1 will be in a conduction state and thus a low-resistance discharge path towards the ground GND is formed. As a result, the low-resistance discharge path keeps the large current from flowing through the first switching component SW1 and realizes the effect of protecting the first switching component SW1. Similarly, when a large transient current from the antenna 12 enters the second matching circuit 18, the voltage across the diode D3 will be greater than the second threshold voltage, and thus the diode D3 will be in a conduction state and thus a low-resistance discharge path towards the ground GND is formed. As a result, the low-resistance discharge path keeps the large current from flowing through the second switching component SW2 and realizes the effect of protecting the second switching component SW2.

In some exemplary embodiments, the first switching component SW1 is an N-MOSFET, and the second switching component SW2 is an N-MOSFET.

Figure 9:
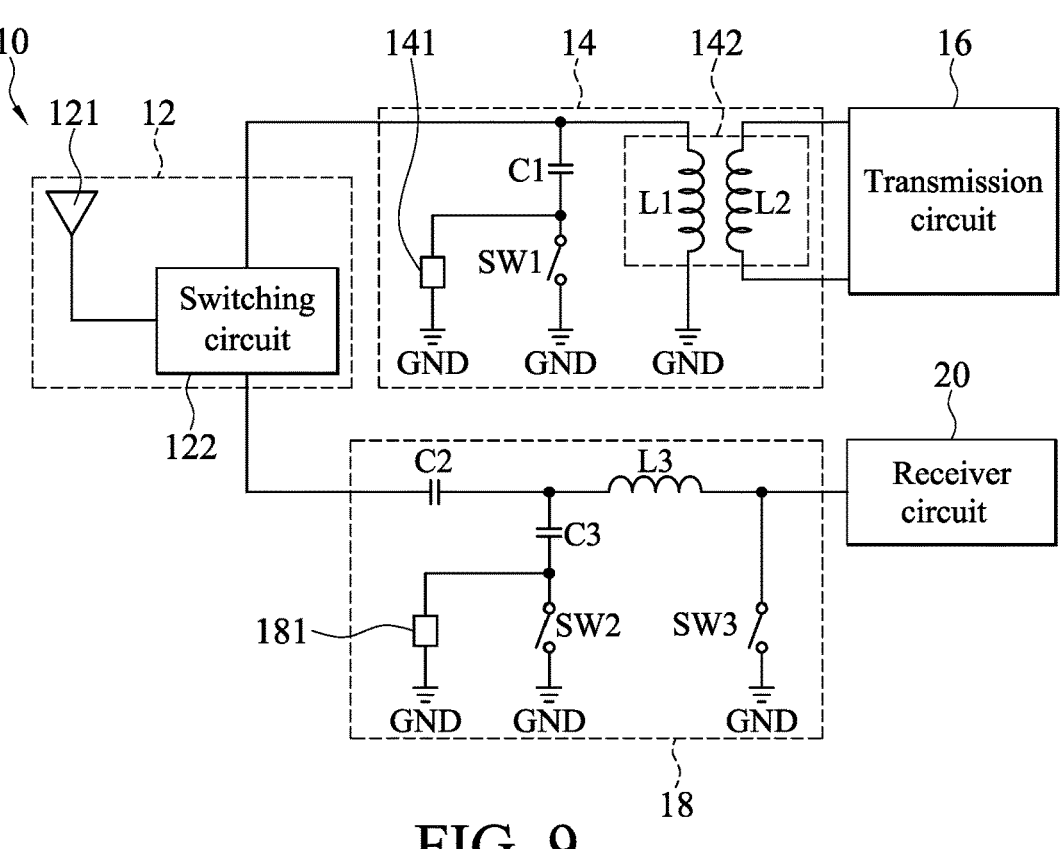
FIG. 9 illustrates a schematic circuit diagram of a wireless transceiver device according to yet another exemplary embodiment of the instant disclosure.

Please refer to FIG. 9. FIG. 9 illustrates a schematic circuit diagram of a wireless transceiver device according to yet another exemplary embodiment of the instant disclosure. The wireless transceiver device 10 comprises an antenna 12, a first matching circuit 14, a transmission circuit 16, a second matching circuit 18, and a receiver circuit 20. In this embodiment, the connection among the circuits and the detailed circuit structure of the first matching circuit 14 are identical to those of the previous embodiments, and thus can be referred to the aforementioned illustration and will not be repeated here. In this embodiment, the second matching circuit 18 comprises a second capacitor C2, a third inductor L3, a third capacitor C3, a second switching component SW2, and a second active component 181 having a second threshold voltage, and a third switching component SW3. One of two terminals of the second capacitor C2 is electrically coupled to the antenna 12, and the other terminal of the second capacitor C2 is electrically coupled to the third inductor L3. The third inductor L3 is electrically coupled the other terminal of the second capacitor C2 and the receiver circuit 20. One of two terminals of the third capacitor C3 is electrically coupled between the second capacitor C2 and the third inductor L3, and the other terminal of the third capacitor C3 is electrically coupled to the second switching component SW2. One of two terminals of the second switching component SW2 is electrically coupled to the third capacitor C3, and the other terminal of the second switching component SW2 is electrically coupled to the ground GND. One of two terminals of the second active component 181 is electrically coupled between the third capacitor C3 and the second switching component SW2, and the other terminal of the second active component 181 is electrically coupled to the ground GND. As a result, the second active component 181 is coupled in parallel with the second switching component SW2. When the voltage across the second active component 181 is greater than the second threshold voltage, the second active component is turned on and in a conduction state, thus reducing the voltage across the second switching component SW2 so as to realize the effect of protecting the second switching component SW2. One of two terminals of the third switching component SW3 is electrically coupled between the third inductor L3 and the receiver circuit 20, and the other terminal of the third switching component SW3 is electrically coupled to the ground GND.

Figure 10:
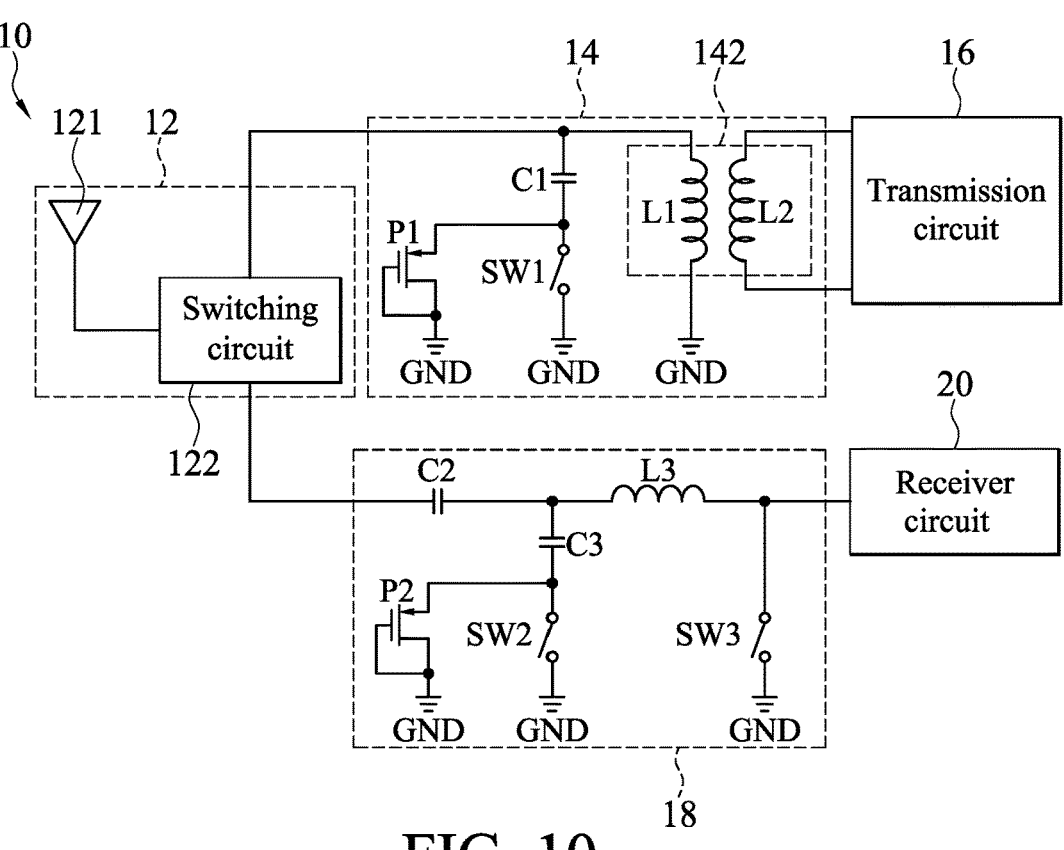
FIG. 10 illustrates a schematic circuit diagram of a wireless transceiver device having a P-MOSFET according to yet another exemplary embodiment of the instant disclosure.

Please refer to both FIG. 9 and FIG. 10. FIG. 10 illustrates a schematic circuit diagram of a wireless transceiver device having a P-MOSFET according to yet another exemplary embodiment of the instant disclosure. In this exemplary embodiment, in the first matching circuit 14, the first active component 141 is a P-MOSFET P1, and in the second matching circuit 18, the second active component 181 is a P-MOSFET P2, as shown in FIG. 10. The source of the P-MOSFET P1 is coupled between the first capacitor C1 and the first switching component SW1, and the gate and the drain of the P-MOSFET P1 are both coupled to the ground GND, so that the P-MOSFET P1 is coupled in parallel with the first switching device SW1. The source of the P-MOSFET P2 is coupled between the third capacitor C3 and the second switching component SW2, and the gate and the drain of the P-MOSFET P2 are both coupled to the ground GND, so that the P-MOSFET P2 is coupled in parallel with the second switching device SW2. When a large transient current from the antenna 12 enters the first matching circuit 14, the voltage across the diode D1 will be greater than the first threshold voltage, and thus the diode D1 will be in a conduction state and thus a low-resistance discharge path towards the ground GND is formed. As a result, the low-resistance discharge path keeps the large current from flowing through the first switching component SW1 and realizes the effect of protecting the first switching component SW1. Similarly, when a large transient current from the antenna 12 enters the second matching circuit 18, the voltage across the diode D2 will be greater than the second threshold voltage, and thus the diode D2 will be in a conduction state and thus a low-resistance discharge path towards the ground GND is formed. As a result, the low-resistance discharge path keeps the large current from flowing through the second switching component SW2 and realizes the effect of protecting the second switching component SW2.

Figure 11:
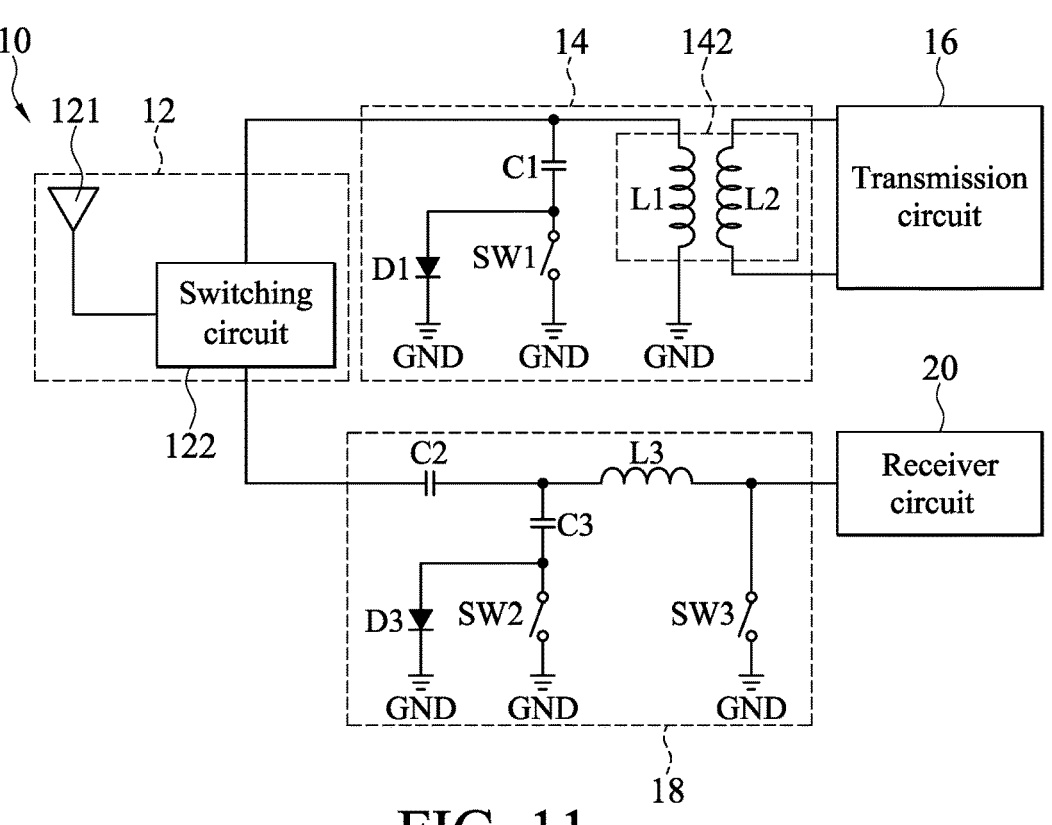
FIG. 11 illustrates a schematic circuit diagram of a wireless transceiver device having a diode according to yet another exemplary embodiment of the instant disclosure.

Please refer to both FIG. 9 and FIG. 11. FIG. 11 illustrates a schematic circuit diagram of a wireless transceiver device having a diode according to yet another exemplary embodiment of the instant disclosure. In this exemplary embodiment, in the first matching circuit 14, the first active component 141 is a diode D1, and in the second matching circuit 18, the second active component 181 is also a diode D3, as shown in FIG. 11. The anode of the diode D1 is coupled between the first capacitor C1 and the first switching component SW1, and the cathode of the diode D1 is coupled to the ground GND, so that the diode D1 is coupled in parallel with the first switching device SW1. The anode of the diode D3 is coupled between the third capacitor C3 and the second switching component SW2, and the cathode of the diode D3 is coupled to the ground GND, so that the diode D3 is coupled in parallel with the second switching device SW2. When a large transient current from the antenna 12 enters the first matching circuit 14, the voltage across the diode D1 will be greater than the first threshold voltage, and thus the diode D1 will be in a conduction state and thus a low-resistance discharge path towards the ground GND is formed. As a result, the low-resistance discharge path keeps the large current from flowing through the first switching component SW1 and realizes the effect of protecting the first switching component SW1. When a large transient current from the antenna 12 enters the second matching circuit 18, the voltage across the diode D3 will be greater than the second threshold voltage, and thus the diode D3 will be in a conduction state and thus a low-resistance discharge path towards the ground GND is formed. As a result, the low-resistance discharge path keeps the large current from flowing through the second switching component SW2 and realizes the effect of protecting the second switching component SW2.

Figure 12:
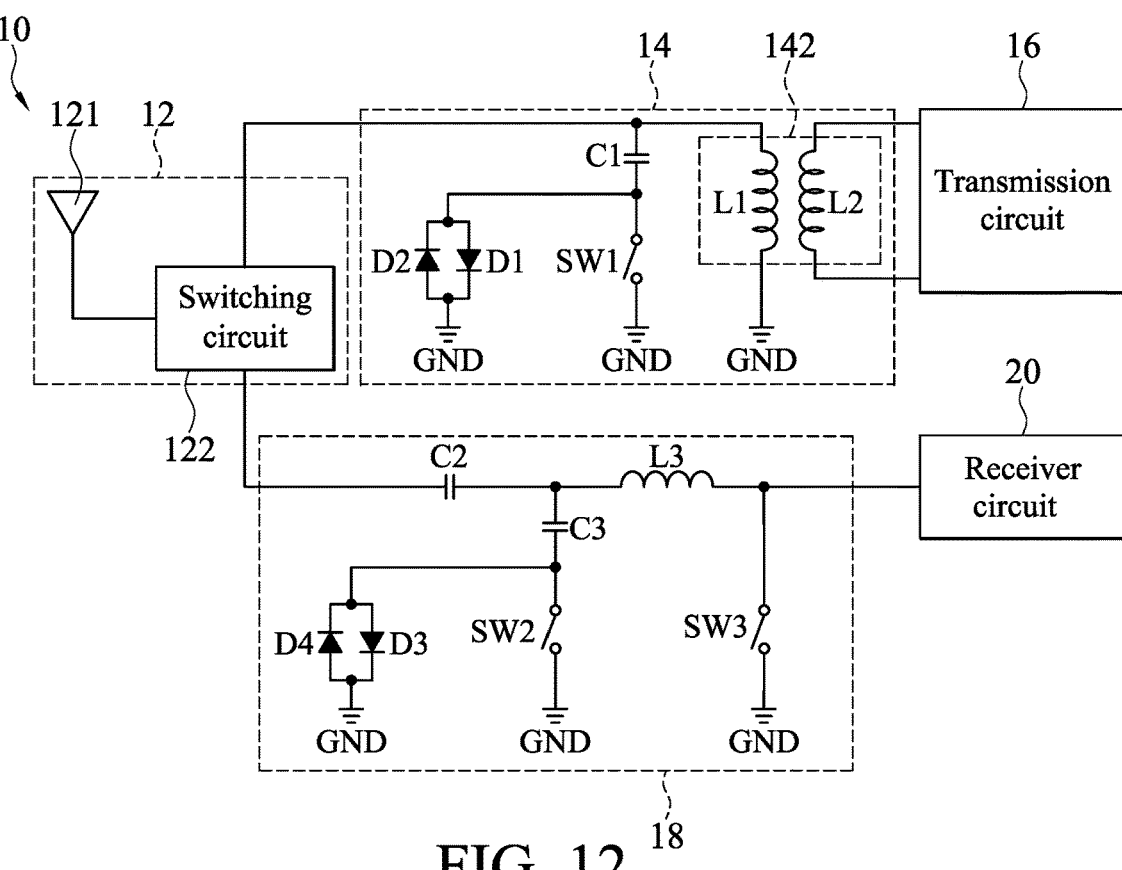
FIG. 12 illustrates a schematic circuit diagram of a wireless transceiver device having two inversely shunted diodes according to yet another exemplary embodiment of the instant disclosure.

Please refer to both FIG. 9 and FIG. 12. FIG. 12 illustrates a schematic circuit diagram of a wireless transceiver device having two inversely shunted diodes according to yet another exemplary embodiment of the instant disclosure. In this exemplary embodiment, in the first matching circuit 14, the first active component 141 is two inversely shunted diodes D1, D2, and in the second matching circuit 18, the second active component 181 is two inversely shunted diodes D3, D4, as shown in FIG. 12. The anode of the diode D1 is coupled between the first capacitor C1 and the first switching component SW1, and the cathode of the diode D1 is coupled to the ground GND. The cathode of the diode D2 is coupled between the first capacitor C1 and the first switching component SW1, and the anode of the diode D2 is coupled to the ground GND, so that the diodes D1, D2 are inversed and coupled in parallel with each other, and the diodes D1, D2 are also coupled in parallel with the first switching device SW1 so as to provide bidirectional protection The anode of the diode D3 is coupled between the third capacitor C3 and the second switching component SW2, and the cathode of the diode D3 is coupled to the ground GND The cathode of the diode D4 is coupled between the third capacitor C3 and the second switching component SW2, and the anode of the diode D4 is coupled to the ground GND, so that the diodes D3, D4 are inversed and coupled in parallel with each other, and the diodes D3, D4 are also coupled in parallel with the second switching device SW2 so as to provide bidirectional protection. When a large transient current from the antenna 12 enters the first matching circuit 14, the voltage across the diode D1 will be greater than the first threshold voltage, and thus the diode D1 will be in a conduction state and thus a low-resistance discharge path towards the ground GND is formed. As a result, the low-resistance discharge path keeps the large current from flowing through the first switching component SW1 and realizes the effect of protecting the first switching component SW1. Similarly, when a large transient current from the antenna 12 enters the second matching circuit 18, the voltage across the diode D3 will be greater than the second threshold voltage, and thus the diode D3 will be in a conduction state and thus a low-resistance discharge path towards the ground GND is formed. As a result, the low-resistance discharge path keeps the large current from flowing through the second switching component SW2 and realizes the effect of protecting the second switching component SW2.

In some exemplary embodiments, the first switching component SW1 is an N-MOSFET, the second switching component SW2 is an N-MOSFET, and the third switching component is an N-MOSFET.

In summary of the above, the instant disclosure provides a wireless transceiver device and matching circuits thereof. In the wireless transceiver device and the matching circuits thereof according to one or some embodiments of the instant disclosure, an active component having a threshold voltage is coupled in parallel with the switching component. The switching component is prone to damage due to large transient current. As a result, the voltage across the active component is used to turn on the active component, and thus the active component forms a low-resistance discharge path towards the ground. Consequently, the voltage across the switching component is reduced, and the effect of protecting the switching component is realized.

The foregoing outlines features of several embodiments so that those skilled in the art may better understand the aspects of the instant disclosure. Those skilled in the art should appreciate that they may readily use the instant disclosure as a basis for designing or modifying other processes and structures for carrying out the same purposes and/or achieving the same advantages of the embodiments introduced herein. Those skilled in the art should also realize that such equivalent constructions do not depart from the spirit and scope of the instant disclosure, and that they may make various changes, substitutions, and alterations herein without departing from the spirit and scope of the instant disclosure.

What is claimed is:

1. A device comprising:
an antenna adapted to emit a first radio frequency (RF) signal or receive a second radio frequency signal;
a transmission circuit adapted to generate the first radio frequency signal;
a first matching circuit electrically coupling the antenna and the transmission circuit and configured to transmit the first radio frequency signal to the antenna, the first matching circuit including:
a first capacitor having two terminals, one of which being electrically coupled to the antenna;
a first switching component electrically coupling the other terminal of the first capacitor and a reference voltage;
a first active component having a first threshold voltage and electrically coupled in parallel with the first switching component, wherein when a voltage across the first active component is greater than the first threshold voltage, the first active component is turned on and in a conduction state, thus reducing a voltage across the first switching component;
a first inductor electrically coupled with the antenna and the reference voltage and electrically coupled in parallel with the first capacitor and the first switching component; and
a second inductor electrically coupled with the transmission circuit;
a second matching circuit electrically coupled with the antenna for transmitting the second radio frequency signal; and
a receiver circuit electrically coupled with the second matching circuit for receiving the second radio frequency signal from the second matching circuit.

2. The device according to claim 1, wherein the second matching circuit comprises:
a third inductor, wherein one of two terminals of the third inductor is electrically coupled to the antenna;
a second capacitor electrically coupling the other terminal of the third inductor and the receiver circuit; and
a second switching component, wherein one of two terminals of the second switching component is electrically coupled between the third inductor and the second capacitor, and the other terminal of the second switching component is electrically coupled to the reference voltage.

3. The device according to claim 2, wherein the second matching circuit further comprises a second active component having a second threshold voltage and electrically coupled in parallel with the second switching component; when the voltage across the second active component is greater than the second threshold voltage, the second active component is turned on and in a conduction state, thus reducing the voltage across the second switching component.

4. The device according to claim 1, wherein the second matching circuit comprises:

a second capacitor, wherein one of two terminals of the second capacitor is electrically coupled to the antenna;

a third inductor electrically coupling the other terminal of the second capacitor and the receiver circuit;

a third capacitor, wherein one of two terminals of the third capacitor is electrically coupled between the second capacitor and the third inductor;

a second switching component, wherein one of two terminals of the second switching component is electrically coupled to the third capacitor, and the other terminal of the second switching component is electrically coupled to the reference voltage;

a second active component having a second threshold voltage and electrically coupled in parallel with the second switching component, wherein when the voltage across the second active component is greater than the second threshold voltage, the second active component is turned on and in a conduction state, thus reducing the voltage across the second switching component; and a third switching component, wherein one of two terminals of the third switching component is electrically coupled between the third inductor and the receiver circuit, and the other terminal of the third switching component is electrically coupled to the reference voltage.

5. The device according to claim 1, wherein the first active component is a P-type metal-oxide semiconductor field-effect transistor (P-MOSFET), a diode, or two inversely shunted diodes.

6. The device according to claim 3, wherein the second active component is a P-type metal-oxide semiconductor field-effect transistor, a diode, or two inversely shunted diodes.

7. The device according to claim 4, wherein the second active component is a P-type metal-oxide semiconductor field-effect transistor, a diode, or two inversely shunted diodes.

8. A first matching circuit of a device, wherein the first matching circuit is electrically coupled between an antenna and a transmission circuit, and the first matching circuit comprises:

a first capacitor, wherein one of two terminals of the first capacitor is electrically coupled to the antenna;

a first switching component electrically coupling the other terminal of the first capacitor and a reference voltage;

a first active component having a first threshold voltage and electrically coupled in parallel with the first switching component, wherein when a voltage across the first active component is greater than the first threshold voltage, the first active component is turned on and in a conduction state, thus reducing a voltage across the first switching component; and an inductor pair having a first inductor and a second inductor, wherein the first inductor is electrically coupled the antenna and the reference voltage and is electrically coupled in parallel with the first capacitor and the first switching component, and the second inductor is electrically coupled to the transmission circuit.

9. The first matching circuit according to claim 8, wherein the first active component is a P-type metal-oxide semiconductor field-effect transistor, a diode, or two inversely shunted diodes.

10. A second matching circuit of a device, wherein the second matching circuit is electrically coupled between an antenna and a receiver circuit, and the second matching circuit comprises:

a third inductor, wherein one of two terminals of the third inductor is electrically coupled and the antenna;

a second capacitor electrically coupling the other terminal of the third inductor and the receiver circuit;

a second switching component, wherein one of two terminals of the second switching component is electrically coupled between the third inductor and the second capacitor, and the other terminal of the second switching component is electrically coupled to a reference voltage;

a second active component having a second threshold voltage and electrically coupled in parallel with the second switching component, wherein when a voltage across the second active component is greater than the second threshold voltage, the second active component is turned on and in a conduction state, thus reducing a voltage across the second switching component.

11. The second matching circuit according to claim 10, wherein the second active component is a P-type metal-oxide semiconductor field-effect transistor, a diode, or two inversely shunted diodes.

* * * * *